United States Patent
Mizutani et al.

(10) Patent No.: US 10,752,992 B2
(45) Date of Patent: Aug. 25, 2020

(54) ATOMIC LAYER DEPOSITION METHOD OF METAL-CONTAINING THIN FILM

(71) Applicant: Kojundo Chemical Laboratory Co., Ltd., Sakado-shi, Saitama (JP)

(72) Inventors: Fumikazu Mizutani, Sakado (JP); Shintaro Higashi, Sakado (JP)

(73) Assignee: KOJUNDO CHEMICAL LABORATORY CO., LTD., Sakado-Shi, Saitama (JP)

( * ) Notice: Subject to any disclaimer, the term of this patent is extended or adjusted under 35 U.S.C. 154(b) by 5 days.

(21) Appl. No.: 16/194,835

(22) Filed: Nov. 19, 2018

(65) Prior Publication Data
US 2019/0203357 A1   Jul. 4, 2019

(30) Foreign Application Priority Data
Sep. 20, 2017   (JP) ................... 2017-179819

(51) Int. Cl.
C23C 16/18       (2006.01)
C23C 16/455      (2006.01)
(Continued)

(52) U.S. Cl.
CPC ........ C23C 16/45553 (2013.01); C23C 16/18 (2013.01); C07F 5/00 (2013.01); C23C 14/542 (2013.01)

(58) Field of Classification Search
CPC .............. C23C 16/18; C23C 16/45525; C23C 16/45553
See application file for complete search history.

(56) References Cited

U.S. PATENT DOCUMENTS

2008/0102205 A1* 5/2008 Barry ............... C23C 16/18
                                                 427/250
2011/0146568 A1* 6/2011 Haukka ............ C23C 16/45555
                                                 118/200

FOREIGN PATENT DOCUMENTS

EP       2492273 A1     8/2012

OTHER PUBLICATIONS

Choi, et al., "Low temperature $Ga_2O_3$ atomic layer deposition using gallium tri-isopropoxide and water", Thin Solid Films 546, 2013, pp. 31-34.

(Continued)

*Primary Examiner* — Elizabeth A Burkhart
(74) *Attorney, Agent, or Firm* — Buchanan Ingersoll & Rooney PC

(57) ABSTRACT

Provided is a method for depositing a gallium-containing thin film by atomic layer deposition (ALD) without using radical species such as plasma and ozone using a gallium-containing precursor having a high vapor pressure even at low temperature and high thermal stability. Gallium (I) having a cyclopentadienyl ligand as illustrated below has a sufficiently high thermal decomposition temperature, a sufficiently high vapor pressure at a low temperature, and high reactivity, and as a result, is suitable for low temperature ALD. An atomic layer deposition method of a metal-containing thin film using a precursor represented by the following general formula (1) (In general formula (1), $R^1$ to $R^5$ each independently represent a hydrogen atom or an alkyl group having 1 to 4 carbon atoms).

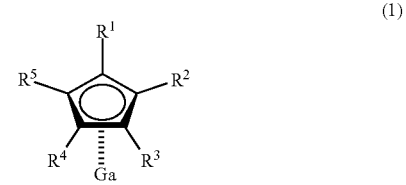

(1)

3 Claims, 1 Drawing Sheet

(51) Int. Cl.
*C23C 14/54* (2006.01)
*C07F 5/00* (2006.01)

(56) References Cited

OTHER PUBLICATIONS

Donmez, et al., "Low temperature deposition of $Ga_2O_3$ thin films using trimethylgallium and oxygen plasma", Journal of Vacuum Science & Technology A 31(1), Jan./Feb. 2013, pp. 01A110-1 to 01A110-4.

Jutzi, et al., "A novel synthetic route to pentaalkylcyclopentadienylgallium (I) compounds", Journal of Organometallic Chemistry 654, 2002, pp. 176-179.

Jutzi, et al., "Pentamethylcyclopentadienylgallium (Cp*Ga): Alternative Synthesis and Application as a Terminal and Bridging Ligand in the Chemistry of Chromium, Iron, Cobalt, and Nickel", Organomeltallics, 1998, 17, pp. 1305-1314.

* cited by examiner

ATOMIC LAYER DEPOSITION METHOD OF METAL-CONTAINING THIN FILM

BACKGROUND OF THE INVENTION

Field of the Invention

The present invention relates to a method for forming a gallium-containing thin film by atomic layer deposition.

Description of the Related Art

An atomic layer deposition (ALD) method is known as a technique having better step coverage and film thickness controllability than a common chemical vapor deposition (CVD) method. The ALD method is a technique for forming a thin film in atomic layer units, and is a film forming method usually performed by repeating two steps of (1) forming only one atomic layer of a precursor to react with or to be adsorbed on a surface of a substrate and purging an excess precursor, and (2) supplying a reactive gas such as an oxidizing agent or a reducing agent to cause a react with the precursor on the substrate so as to obtain an intended composition of the film. As described above, the ALD method is characterized by having excellent step coverage and film thickness controllability because the precursor is not deposited continuously but deposited one layer by one layer. In addition, the ALD method can form an insulating film at a relatively low temperature because the ALD method does not thermally decompose a precursor. As a result, for example, the ALD method is expected to be also used for forming a capacitor of as a memory element and a gate insulating film for a thin-film transistor in a display device using a glass substrate, such as a liquid crystal display.

Specifically, in the ALD method, a vaporized precursor is adsorbed on a substrate to saturation at a temperature at which the precursor is not thermally decomposed, and chemically reacts with a reactive gas on a surface of the substrate in a next step, thus depositing a desired material. For example, EP 2492273 A1 discloses a method for depositing a gallium-containing thin film by the ALD method using a low melting point, volatile, and thermally stable gallium compound. EP 2492273 A1 discloses a method for depositing a gallium nitride thin film at 550° C. using [Me$_2$Ga(NEtMe)]$_2$ as a gallium source and using ammonia as a reactive gas, a method for depositing a gallium oxide thin film at 500° C. using [Me$_2$Ga(NEtMe)]$_2$ as a gallium source and using ozone as a reactive gas, and the like.

D-w. Choi et al., "Low temperature Ga$_2$O$_3$ atomic layer deposition using gallium tri-isopropoxide and water", Thin Solid Films 546, (2013) 31-34 discloses a Ga$_2$O$_3$ atomic layer deposition (ALD) method for depositing a thin film on a glass substrate at 150 to 250° C. using gallium triisopropoxide (Ga(OiPr)$_3$) as a gallium source and using water as an oxygen source.

I Donmez et al., "Low temperature deposition of Ga$_2$O$_3$ thin films using trimethylgallium and oxygen plasma", Journal of Vacuum Science & Technology A 31, (2013), 01A110-1-01A110-4 discloses a method for depositing a Ga$_2$O$_3$ thin film by plasma enhanced ALD (PEALD) using trimethylgallium as a gallium source and using oxygen plasma as an oxidizing agent. According to the method of I Donmez et al., Journal of Vacuum Science & Technology A 31, (2013), 01A110-1-01A110-4, a polycrystalline β-Ga$_2$O$_3$ phase is formed by performing ALD at 250° C. at a film deposition rate of 0.53 Å/cycle and then annealing the resulting product at 900° C. for 30 minutes.

However, according to the method described in EP 2492273 A1, it is necessary to perform a reaction at a temperature close to 450° C. In addition, a precursor at this time is a solid at room temperature of 23° C., and handling thereof is not easy. According to the method described in D-w. Choi et al., Thin Solid Films 546, (2013) 31-34, film formation is performed at 150 to 250° C. However, this Ga(OiPr)$_3$ is also a solid and requires careful handling. In addition, in the method described in I Donmez et al., Journal of Vacuum Science & Technology A 31, (2013), 01A110-1-01A110-4, film formation is performed at a low temperature of 100 to 400° C. using trimethylgallium which is a liquid at normal temperature and oxygen plasma. However, when oxygen is used, radical species are generated by plasma. As a result, step coverage may be deteriorated due to deactivation of the radical species during deposition.

As described in Introduction of D-w. Choi et al., Thin Solid Films 546, (2013) 31-34, there is a need for a gallium precursor capable of low temperature ALD. However, most of Ga precursors known up to now require a high temperature of 300° C. or higher. As ALD at a relatively low temperature, D-w. Choi et al., Thin Solid Films 546, (2013) 31-34 and I Donmez et al., Journal of Vacuum Science & Technology A 31, (2013), 01A110-1-01A110-4 are cited. However, Ga(OiPr)$_3$ of D-w. Choi et al., Thin Solid Films 546, (2013) 31-34 has a problem of a low vapor pressure at a low temperature. Meanwhile, I Donmez et al., Journal of Vacuum Science & Technology A 31, (2013), 01A110-1-01A110-4 has problems concerning plasma generation and control as described above.

SUMMARY OF THE INVENTION

An object of the present invention is to provide a method for depositing a gallium-containing thin film by atomic layer deposition (ALD) without using radical species such as plasma and ozone using a gallium-containing precursor having a high vapor pressure even at low temperature and high thermal stability.

The present invention includes the following matters.

An atomic layer deposition (ALD) method of a metal-containing thin film according to an aspect of the present invention uses a precursor represented by the following general formula (1).

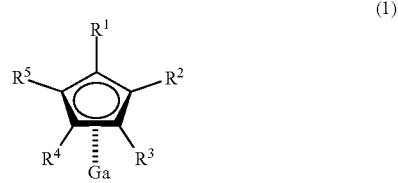

(1)

In general formula (1), R$^1$ to R$^5$ each independently represent a hydrogen atom or an alkyl group having 1 to 4 carbon atoms.

In the general formula (1), when four of R$^1$ to R$^5$ are hydrogen atoms, the remaining one is preferably an alkyl group having 1 to 4 carbon atoms, and when four of R$^1$ to R$^5$ are methyl groups, the remaining one is preferably a methyl group, a n-propyl group, or an isopropyl group. Furthermore, all of R$^1$ to R$^5$ are preferably methyl groups.

Gallium (I) having a cyclopentadienyl ligand according to an aspect of the present invention has a sufficiently high thermal decomposition temperature, a sufficiently high vapor pressure at a low temperature, and high reactivity, and as a result, is suitable for low temperature ALD.

DESCRIPTION OF THE PREFERRED EMBODIMENTS

Figure 1:
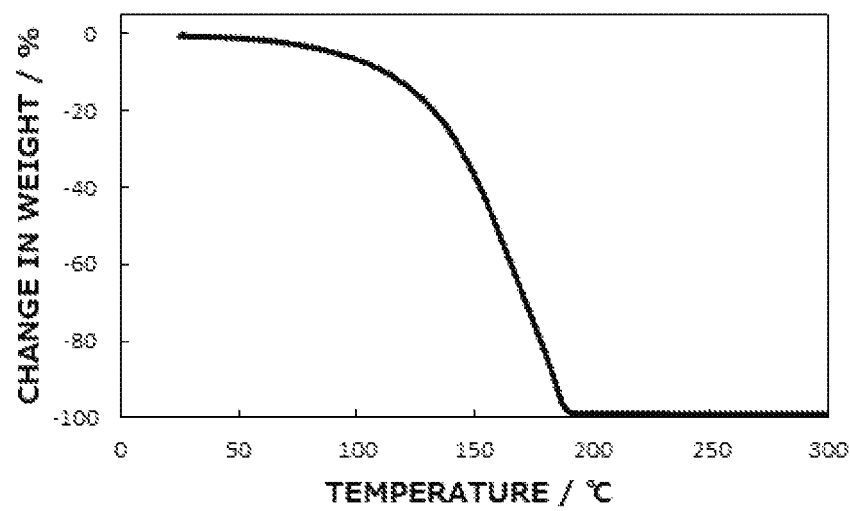
FIG. 1 illustrates a thermogravimetric analysis result of $Ga(C_5(CH_3)_5)$.

An atomic layer deposition (ALD) method of a metal-containing thin film according to an aspect of the present invention is characterized by using a precursor represented by the following general formula (1).

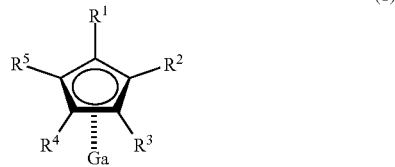

(1)

In general formula (1), $R^1$ to $R^5$ each independently represent a hydrogen atom or an alkyl group having 1 to 4 carbon atoms.

In the general formula (1), when four of $R^1$ to $R^5$ are hydrogen atoms, the remaining one is preferably an alkyl group having 1 to 4 carbon atoms, and when four of $R^1$ to $R^5$ are methyl groups, the remaining one is preferably a methyl group, a n-propyl group, or an isopropyl group.

Specifically, the precursor represented by general formula (1) is particularly preferably $\eta^5$-pentamethylcyclopentadienylgallium (I), which is also referred to as "Cp*Ga" or "$Ga(C_5(CH_3)_5)$" below, represented by the following structural formula.

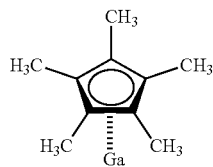

The precursor represented by the general formula (1) can be manufactured by various known methods. For example, Cp*Ga can be synthesized by a method described in P. Jutzi et al., "A novel synthetic route to pentaalkylcyclopentadienylgallium (I) compounds", Journal of Organometallic Chemistry 654 (2002) 176-179. Specifically, Ga grains and $I_2$ are put in toluene at a molar ratio of 2:1 and applied ultrasonic waves at 50° C. for 12 hours to react with each other. Cp*K equivalent to the Ga component is added to the resulting light green GaI solution, and the resulting mixture is stirred for 48 hours. At this time, the reaction solution turns yellow, and a light gray precipitate is separated. The precipitate is filtered off, and the toluene is removed to give a yellow oily product. Since the yellow oily product contains (benzyl)pentamethylcyclopentadiene as a by-product in addition to Cp*Ga, by distilling the yellow oily product at 80° C. at 8 Torr, Cp*Ga as a pale yellow liquid is obtained at a yield of 52%. A 1H-NMR spectrum of Cp*Ga substantially matches a δ value of 1.92 ppm (s, 15H, Cp* methyl) in a $^1$H-NMR spectrum for 500.1 MHz ($C_6D_6$) described in P. Jutzi et al., "Pentamethylcyclopentadienylgallium (Cp*Ga): Alternative Synthesis and Application as a Terminal and Bridging Ligand in the Chemistry of Chromium, Iron, Cobalt, and Nickel", Organomeltallics, 1998, 17, 1305-1314, which confirms that the Cp*Ga has the above structure.

Note that Cp*Ga can be synthesized not only by the above method but also by various methods.

The precursor represented by general formula (1) has sufficient volatility and thermal stability. For example, Cp*Ga starts to volatilize at about 40° C. and volatilizes almost 100% before the temperature reaches about 190° C. as illustrated by the thermogravimetric analysis result in FIG. 1. Meanwhile, according to P. Jutzi et al., Organomeltallics, 1998, 17, 1305-1314, this Cp*Ga does not decompose until the temperature reaches about 600° C.

In the ALD method, in practical use, a substrate temperature or a reaction temperature in a step of causing a precursor to be adsorbed on a substrate is the same as that in a step of supplying a reactive gas to cause a reaction between the reactive gas and the precursor on the substrate, and the substrate temperature needs to be lower than a temperature at which the adsorbed precursor is thermally decomposed and needs to be high enough to react sufficiently with the reactive gas. The precursor is supplied as a gas to a reaction chamber in which the substrate is placed from the outside. However, when the precursor is a solid or a liquid, the precursor must be sublimated or vaporized at a temperature lower than the substrate temperature in order to prevent the precursor from being condensed on the substrate. As described above, the precursor for ALD needs (1) to be adsorbed on a substrate in a monolayer, (2) to have a necessary vapor pressure or sublimation pressure, and (3) to be able to form a part of a film by a favorable reaction between an adsorbed precursor and a reactive gas at a temperature sufficiently lower than a thermal decomposition temperature.

The adsorption of a precursor on a substrate in the ALD film formation may be either physical adsorption or chemisorption, and may be adsorption including an elimination reaction of a part not including an element constituting a part or the whole of a film. However, a compound of monovalent gallium and a cyclopentadienyl ligand as the precursor according to an aspect of the present invention is adsorbed in a monolayer at a temperature lower than a thermal decomposition temperature and higher than an evaporation temperature. That is, this compound has a half sandwich structure in which only one cyclopentadienyl ligand is bonded. A gallium atom part is easily adsorbed on a substrate, and a group exposed to a surface after adsorption is only a cyclopentadienyl ligand part. As a result, adsorption of a next layer in a gas phase is unlikely to occur, and monolayer adsorption thus occurs.

In addition, the precursor according to an aspect of the present invention is a liquid at room temperature of 23° C. and has a sufficient vapor pressure even at a low temperature.

Furthermore, the precursor according to an aspect of the present invention is a compound of monovalent gallium and a cyclopentadienyl ligand, and gallium tends to be a trivalent or zero-valent metal. As a result, the precursor according to an aspect of the present invention has high reactivity in a temperature region lower than a thermal decomposition temperature, and is suitable for ALD. The reactive gas for the precursor according to an aspect of the present invention is not limited, but water is preferably used when it is desired to form an oxide film. Oxygen activated by plasma or ozone can also be used as a reactive gas, but the precursor in the present invention has high reactivity. As a result, even a reactive gas containing no radical species can cause ALD film formation even at a low temperature.

EXAMPLES

Hereinafter, the present invention will be described more specifically based on Examples. However, the present invention is not limited by the following Examples.

Example 1

$Ga(C_5(CH_3)_5)$ was synthesized in a similar procedure to that described in P. Jutzi et al., Journal of Organometallic Chemistry 654 (2002) 176-179. Since $Ga(C_5(CH_3)_5)$ had been expected to be extremely sensitive to light and heat, synthesis was performed in an inert gas.

In a $^1$H-NMR spectrum for 400 MHz ($C_6D_6$), a peak of 1.928 ppm (s, 15H, Cp* methyl) corresponding to a methyl group of Cp* substantially matched a value of 1.92 ppm (s, 15H, Cp* methyl) for 500.1 MHz ($C_6D_6$) described in P. Jutzi et al., Organomeltallics, 1998, 17, 1305-1314. The result confirmed that the desired $Ga(C_5(CH_3)_5)$ could be synthesized.

Thermogravimetric analysis of this $Ga(C_5(CH_3)_5)$ was performed in an Ar flow, and as illustrated in FIG. 1, $Ga(C_5(CH_3)_5)$ started to evaporate at about 40° C. and evaporated almost 100% without being thermally decomposed before the temperature reached about 190° C.

When exposed to the atmosphere, this $Ga(C_5(CH_3)_5)$ generated heat with white smoke. In addition, when this $Ga(C_5(CH_3)_5)$ was dissolved in deuterated benzene for NMR measurement, this $Ga(C_5(CH_3)_5)$ reacted vigorously also with a small amount of moisture in this solvent and generated white smoke. Consequently, it was confirmed that $Ga(C_5(CH_3)_5)$ reacted vigorously with water even at room temperature. $Ga(C_5(CH_3)_5)$ is thermally stable up to about 600° C. as described above, which demonstrates that $Ga(C_5(CH_3)_5)$ can suitably be used for ALD even at a low temperature equal to or lower than about 140° C.

Comparative Example 1

Figure 2:
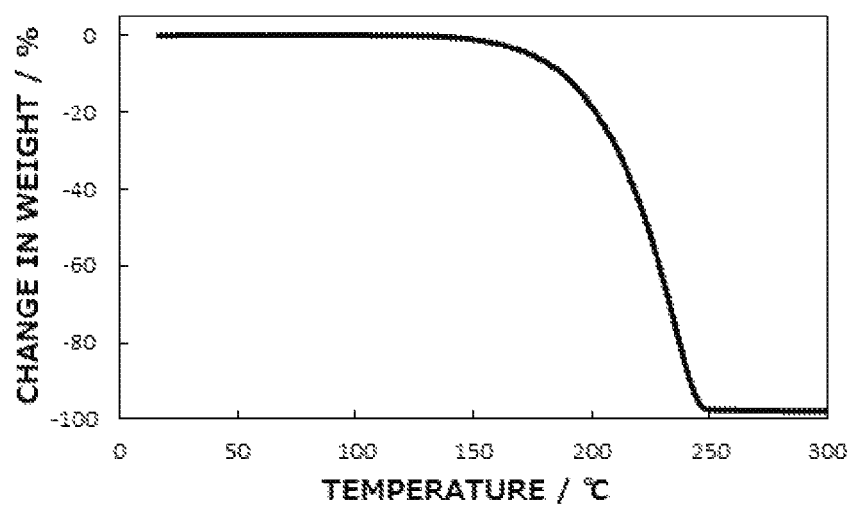
FIG. 2 illustrates a thermogravimetric analysis result of $Ga(OiPr)_3$.

Thermogravimetric analysis of $Ga(OiPr)_3$ described in D-w. Choi et al., Thin Solid Films 546, (2013) 31-34 was performed in place of $Ga(C_5(CH_3)_5)$ in Example 1 in the same way as that in Example 1, and a result as illustrated in FIG. 2 was obtained. $Ga(OiPr)_3$ evaporated almost 100% without being thermally decomposed before the temperature reached about 250° C. However, this $Ga(OiPr)_3$ is a solid at normal temperature, and started to evaporate after melting at about 150° C., which is relatively high. As described in D-w. Choi et al., Thin Solid Films 546, (2013) 31-34, a temperature region suitable for ALD is 150 to 250° C., and a lower limit temperature is higher than that of $Ga(C_5(CH_3)_5)$.

What is claimed is:

1. An atomic layer deposition (ALD) method of a metal-containing thin film using a precursor represented by the following general formula (1):

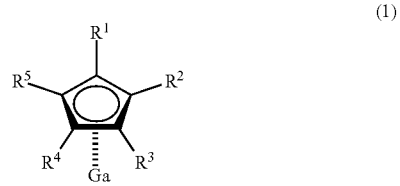

(1)

(in general formula (1), $R^1$ to $R^5$ each independently represent a hydrogen atom or an alkyl group having 1 to 4 carbon atoms).

2. The atomic layer deposition method according to claim 1, wherein
in the general formula (1),
when four of $R^1$ to $R^5$ are hydrogen atoms, the remaining one is an alkyl group having 1 to 4 carbon atoms, and when four of $R^1$ to $R^5$ are methyl groups, the remaining one is a methyl group, a n-propyl group, or an isopropyl group.

3. The atomic layer deposition method according to claim 1, wherein, in the general formula (1), $R^1$ to $R^5$ are all methyl groups.

* * * * *